United States Patent
Cheon

(10) Patent No.: US 6,664,627 B2
(45) Date of Patent: Dec. 16, 2003

(54) WATER COOLING TYPE COOLING BLOCK FOR SEMICONDUCTOR CHIP

(76) Inventor: Kioan Cheon, 33531 7th Pl. SW., Federal Way, WA (US) 98023

(*) Notice: Subject to any disclaimer, the term of this patent is extended or adjusted under 35 U.S.C. 154(b) by 0 days.

(21) Appl. No.: 10/241,132

(22) Filed: Sep. 11, 2002

(65) Prior Publication Data

US 2003/0151130 A1 Aug. 14, 2003

(30) Foreign Application Priority Data

Feb. 8, 2002 (KR) .................................... 2002-0007428

(51) Int. Cl.[7] .............................................. H01L 23/34
(52) U.S. Cl. ...................................... 257/714; 257/712
(58) Field of Search ................................ 257/712, 714, 257/706, 707

(56) References Cited

U.S. PATENT DOCUMENTS

| | | | |
|---|---|---|---|
| 4,573,067 A | * | 2/1986 | Tuckerman et al. |
| 5,016,090 A | * | 5/1991 | Galyon et al. |
| 5,083,373 A | * | 1/1992 | Hamburgen |
| 5,514,906 A | * | 5/1996 | Love et al. |
| 5,520,244 A | * | 5/1996 | Mundinger et al. |
| 6,448,575 B1 | * | 9/2002 | Slocum et al. |
| 6,576,499 B2 | * | 6/2003 | Funaya et al. |

\* cited by examiner

Primary Examiner—Sheila V. Clark
(74) Attorney, Agent, or Firm—Delbert J Barnard

(57) ABSTRACT

Provided is a water cooling type cooling block for a, semiconductor chip which can increase heat transfer efficiency by inducing turbulent flow even if a coolant flows at low speed. The cooling block includes a heat transfer plate contacting the semiconductor chip, a case connected to the heat transfer plate to enclose the heat transfer plate so as to accommodate a coolant for cooling heat from the heat transfer plate and having a coolant inlet port at its first end and a coolant outlet port at its second end so as to allow movement of the coolant, and a sealing means hermetically sealing the heat transfer plate and the case. The heat transfer plate is formed of a metal having high heat conductivity, and has a plurality of ribs entirely shaped of a flat plate on the surface opposite to a surface contacting the semiconductor chip for increasing a heat transfer surface to increase a heat transfer area, to induce turbulent flow of a coolant and to prevent a heat transfer coefficient from decreasing even if the flow rate is reduced. Therefore, a heat transfer area and heat transfer efficiency can be improved by increasing the circulation speed of a coolant. Also, heat resistance can be reduced by inducing turbulent flow of a coolant, which is advantageous for heat transfer. Further, since a user can observe the circulation state of a coolant or the internal state of the cooling block by user's naked eye, the cooling block can be replaced with new one or a coolant can be replaced before cooling efficiency is deteriorated. Further, the temperature of the semiconductor chip can be accurately measured by providing a sensor surrounded by an insulating material.

8 Claims, 12 Drawing Sheets

WATER COOLING TYPE COOLING BLOCK FOR SEMICONDUCTOR CHIP

TECHNICAL FIELD

The present invention relates to a water cooling type cooling block for a semiconductor chip, and more particularly, to a water cooling type cooling block for a semiconductor chip in a central processing unit (CPU) having an improved heat transfer capacity by inducing turbulent flow even if a coolant flows at a low speed.

BACKGROUND OF THE INVENTION

In general, a conventional cooling system used to cool high-temperature heat generated at a semiconductor chip installed in a computer is configured to be disposed in contact with heat-dissipating semiconductor chips to absorb heat into metal and transfer to a coolant or cooling fin for circulation.

In particular, a coolant based cooling system using a coolant is configured to cool a semiconductor chip in a CPU by making a cooling block in which a coolant circulates contact the semiconductor chip.

As shown in FIG. 1, the conventional cooling block includes a heat transfer plate 1 being in contact with a semiconductor chip, having a zigzag passageway in which a coolant flows, and having a coolant inlet port 1a at one end and a coolant outlet port 1b at the other end so as to allow passage of the coolant, a case 2 connected to the heat transfer plate 1 to enclose the heat transfer plate 1 so as to accommodate the coolant for cooling heat from the heat transfer plate 1, and a packing member 3 hermetically sealing the heat transfer plate 1 and the case 2.

In particular, since the conventional water cooling type cooling block is of a passageway type cooling block in which a coolant circulates along a zigzag passageway formed inside the heat transfer plate 1, a contact area between the coolant and metal is small. Thus, if the flow rate is reduced, the heat transfer rate is sharply decreased. To overcome this disadvantage, an attempt to a plurality of cooling devices may be installed, which however makes the cooling block bulky and complex, resulting in deteriorated cooling performance.

Also, since the conventional cooling block has a case formed of an opaque metal, it is impossible for a user to observe a coolant circulating therein or an internal state of the cooling block. Thus, damages of semiconductor chips or deterioration in cooling efficiency due to malfunction of the cooling block cannot be prevented.

BRIEF SUMMARY OF THE INVENTION

To solve the above problems encountered with the conventional passageway type cooling block, it is an object of the present invention to provide a water cooling type cooling block for a semiconductor chip, which can reduce a pressure loss due to coolant circulation and can maximize heat transfer area and heat transfer efficiency by providing a single, wide heat transfer plate having ribs in contact with a coolant flowing therein.

It is another object of the present invention to provide a water cooling type cooling block for a semiconductor chip, which can be replaced with new one or a coolant can be replaced before cooling efficiency is deteriorated by allowing a user to observe circulation of the coolant or formation of foreign matter by user's naked eye.

It is still another object of the present invention to provide a water cooling type cooling block for a semiconductor chip, which can accurately measure the temperature of the semiconductor chip by providing a sensor surrounded by an insulating material.

To accomplish the first object of the present invention, there is provided a water cooling type cooling block for a semiconductor chip comprising a heat transfer plate contacting the semiconductor chip, a case connected to the heat transfer plate to enclose the heat transfer plate so as to accommodate a coolant for cooling heat from the heat transfer plate and having a coolant inlet port at its first end and a coolant outlet port at its second end so as to allow movement of the coolant, and a sealing means hermetically sealing the heat transfer plate and the case, wherein the heat transfer plate is formed of a metal having high heat conductivity, and has a plurality of ribs entirely shaped of a flat plate on the surface opposite to a surface contacting the semiconductor chip for increasing a heat transfer surface to increase a heat transfer area, to induce turbulent flow of a coolant and to prevent a heat transfer coefficient from decreasing even if the flow rate is reduced.

Preferably, a sensor surrounded by an insulating material for accurately measuring the temperature of a semiconductor chip is installed on a surface contacting the semiconductor chip of the heat transfer plate so as to face the heat transfer plate, the ribs are uniformly distributed throughout the heat transfer plate, and a guide member for guiding the coolant to flow toward the semiconductor chip is provided.

Also, the case is preferably formed of a transparent material so as to allow a user to observe the internal state of the case.

The water cooling type cooling block may further include an impeller rotating by the flow of the coolant for identifying the circulation state of the coolant and measuring the flow rate of the coolant, the impeller formed inside the case.

Also, the water cooling type cooling block may further include left and right locking plates latched to hookers of a semiconductor chip mounting plate so as to securely fixing the case to the semiconductor chip, a guide plate having rails at either side installed to adjust the width of each of the locking plates by freely slidable movement of the left and right locking plates, and a tightening screw penetrating through the center of the guide plate to press the guide plate toward the semiconductor chip.

BRIEF DESCRIPTION OF THE SEVERAL VIEWS OF THE DRAWING

Like reference numerals are used to designate like parts throughout the several views of the drawing, and.

The above object and advantages of the present invention will become more apparent by describing in detail preferred embodiments thereof with reference to the attached drawings in which.

DETAILED DESCRIPTION OF THE INVENTION

A water cooling type cooling block for a semiconductor chip according to preferred embodiments of the present invention will now be described in more detail with reference to the accompanying drawings.

Figure 1:
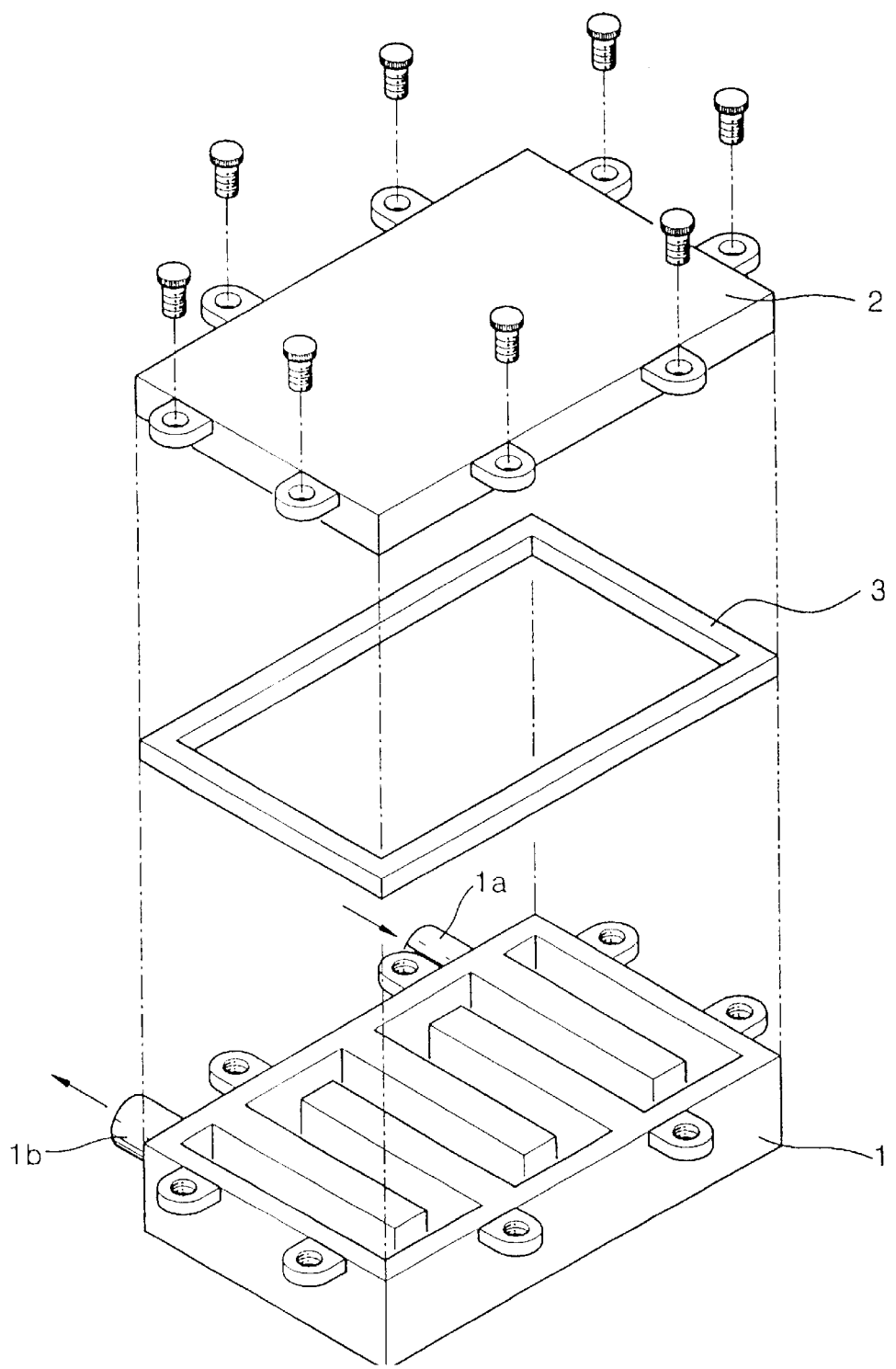
FIG. 1 a partially exploded perspective view of a conventional water cooling type cooling block for a semiconductor chip.
Figure 2:
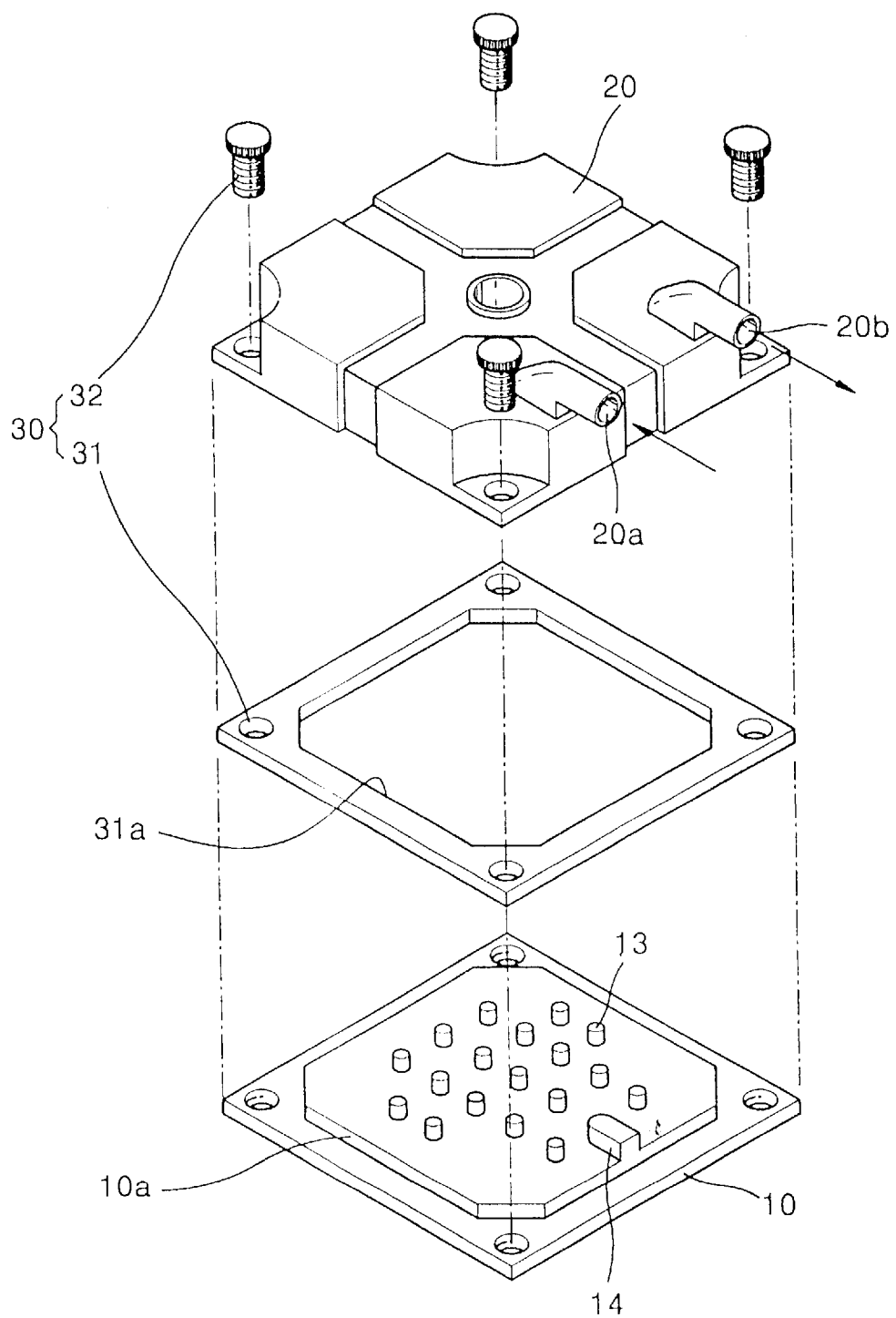
FIG. 2 is a partially exploded perspective view of a water cooling type cooling block for a semiconductor chip according to the present invention.

First, as shown in FIG. 2, a water cooling type cooling block for a semiconductor chip according to a first embodiment of the present invention is largely comprised of a heat transfer plate 10, a case 20 and a sealing device 30.

The heat transfer plate 10 contact with a semiconductor chip to transfer heat of the semiconductor chip to a coolant, is formed of a metal having superior heat conductivity.

Figure 6:
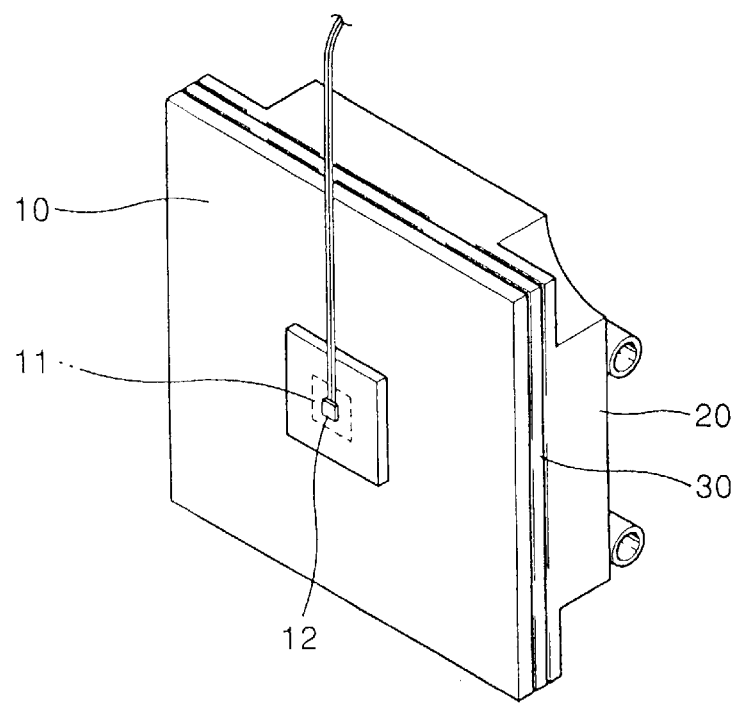
FIG. 6 is a bottom view illustrating the contact surface with the semiconductor chip shown in FIG. 2.

Also, as shown in FIG. 6, a sensor 12 surrounded by an insulating material 11 for accurately measuring the temperature of a semiconductor chip is installed on a surface contacting the semiconductor chip of the heat transfer plate 10 so as to face the heat transfer plate 10.

Thus, since the exothermic temperature of a semiconductor chip can be accurately measured, the temperature of the semiconductor chip can be accurately controlled by appropriately controlling the amount of coolant air of a heat dissipating device for cooling a coolant.

In particular, as shown in FIG. 2, the heat transfer plate 10 according to the present invention has a plurality of cylindrical, pyramidal or polyhedral ribs 13 on the surface opposite to a surface contacting the semiconductor chip to increase a heat transfer area to induce turbulent flow of a coolant.

The ribs 13 may have various shapes, including a circular cylinder, a pyramid, a circular cone, a multilateral column and so on. In order to maximize a heat contact area, the ribs 13 are uniformly distributed throughout the heat transfer plate 10. Alternatively, in order to facilitate heat transfer around the semiconductor chip, the ribs 13 may concentrate on the semiconductor chip.

Figure 4:
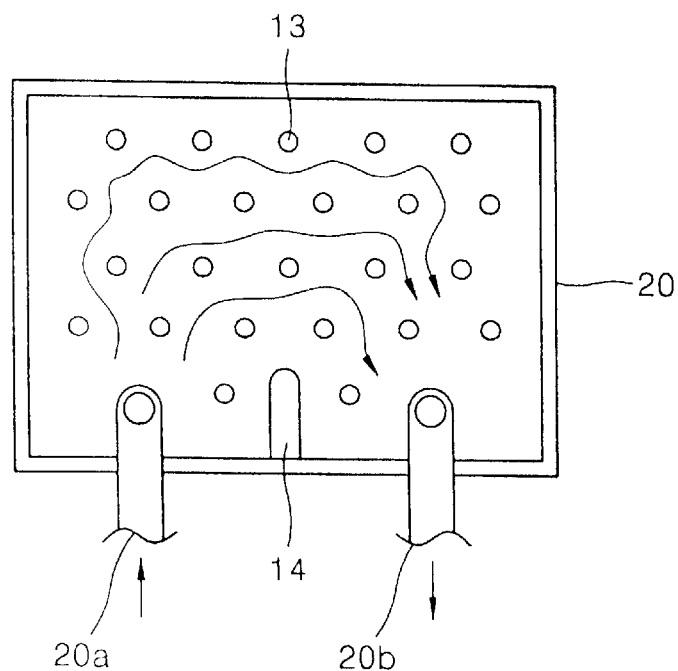
FIG. 4 is a plan view illustrating the flow of a coolant inside the water cooling type cooling block according to the present invention.

A partitioned guide member 14 for guiding the coolant to flow toward the semiconductor chip may be provided. The partitioned guide member 14, as shown in FIG. 4, serves to guide a passageway to be formed toward the semiconductor chip in a "U"-shaped curve, and is distinguished from the conventional zigzag passageway.

Figure 7:
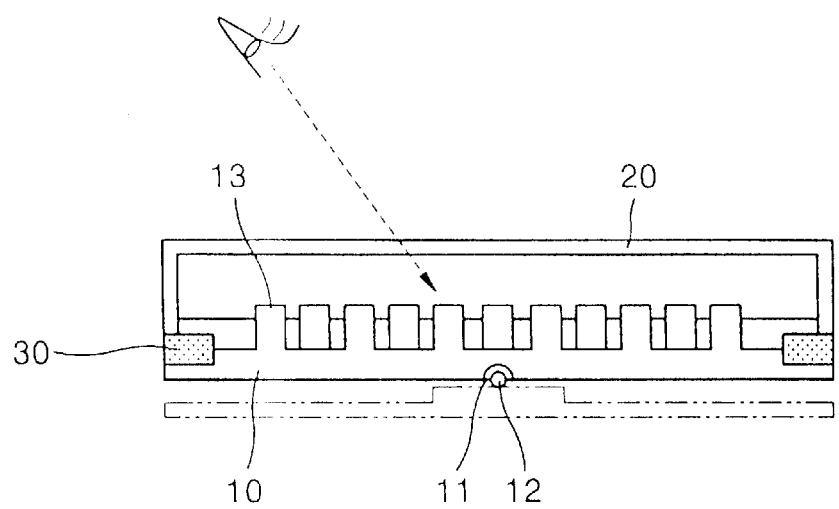
FIG. 7 is a side sectional view illustrating the assembled state of the water cooling type cooling block according to the present invention shown in FIG. 2.

The case 20, which is connected with the heat transfer plate 10, accommodates a coolant for cooling heat from the heat transfer plate 10, and has a coolant inlet port 20a at its first end and a coolant outlet port 20b at its second end for movement of the coolant. As shown in FIG. 7, the case 20 is fabricated of a transparent or semi-transparent material, e.g., synthetic resin or glass, so as to confirm the flow state of the coolant inside the case 20 by naked eye.

Figure 8:
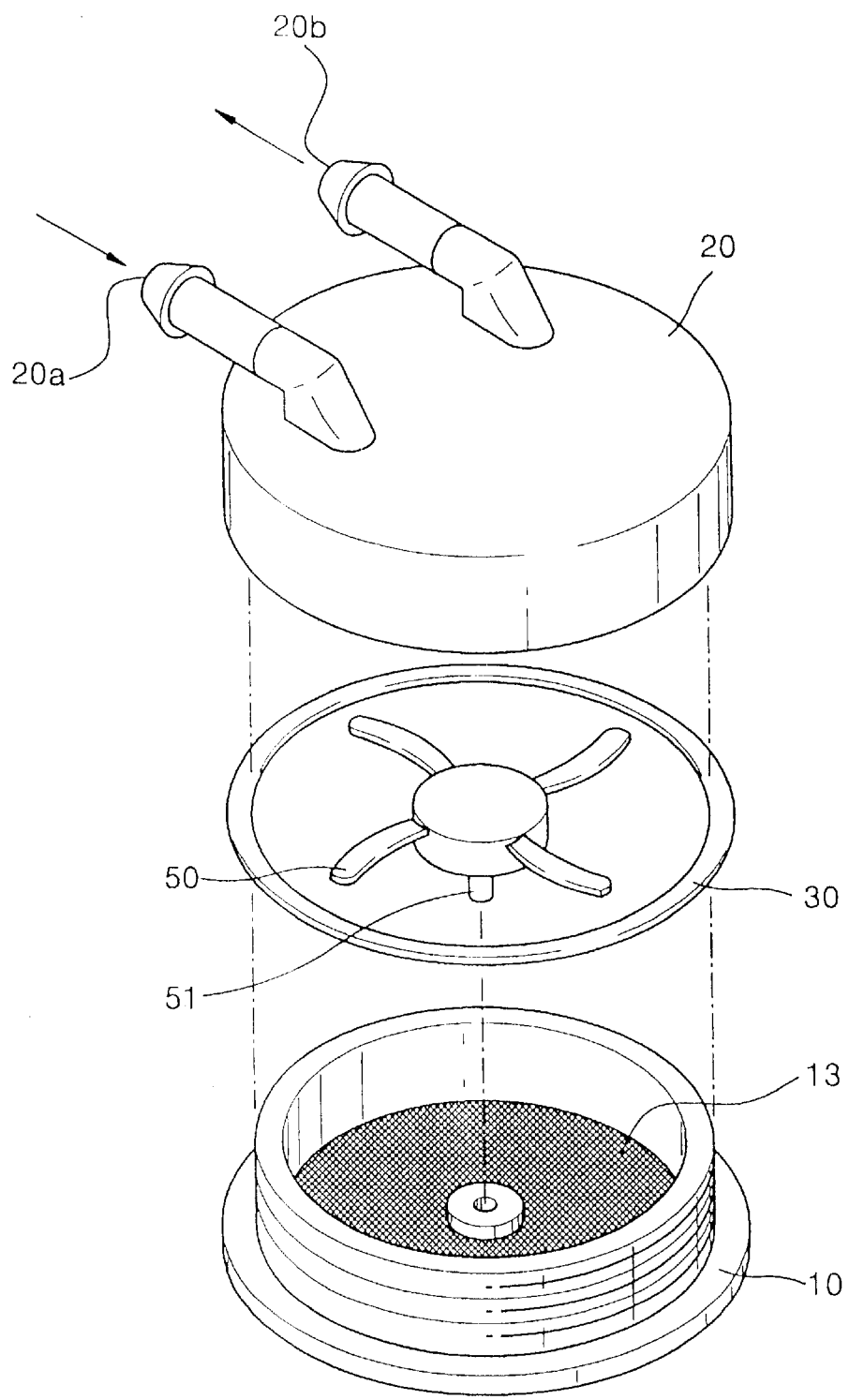
FIG. 8 is an exploded perspective view of a water cooling type cooling block according to another embodiment of the present invention.

Referring back to FIG. 2, the case 20 is formed of a rectangular box having one end opened. Otherwise, the case 20 may be formed of a cylinder shape having one end opened, as shown in FIG. 8.

The sealing device 30 for hermetically sealing the heat transfer plate 10 and the case 20, is configured to be disassembled and includes O-rings 31 disposed between the heat transfer plate 10 and the case 20 and a plurality of tightening screws 32 configured to penetrate corners of the heat transfer plate 10 and the case 20.

In addition, the sealing device 30 may employ a plastic fused sealing method to ensure perfect seal by integrally forming components so as not to be disassembled.

As shown in FIG. 2 showing an example of the sealing device 30, female/male screw sills 10a and 31a engaged by the O-rings 31 and the screws 32 formed at corners of the heat transfer plates 10 and the case 20 may be provided to increase sealing efficiency in cooperation with the O-rings 31 disposed between the heat transfer plate 10 and the case 20.

The user can identify the internal state of the transparent case 20, that is, the flow state of a coolant present inside the case 20 or the presence of foreign matter that is liable to accumulate inside the case 20, and can take necessary steps, e.g., removing scale or foreign matter, by demounting the case 20 from the heat transfer plate 10.

Figure 3:
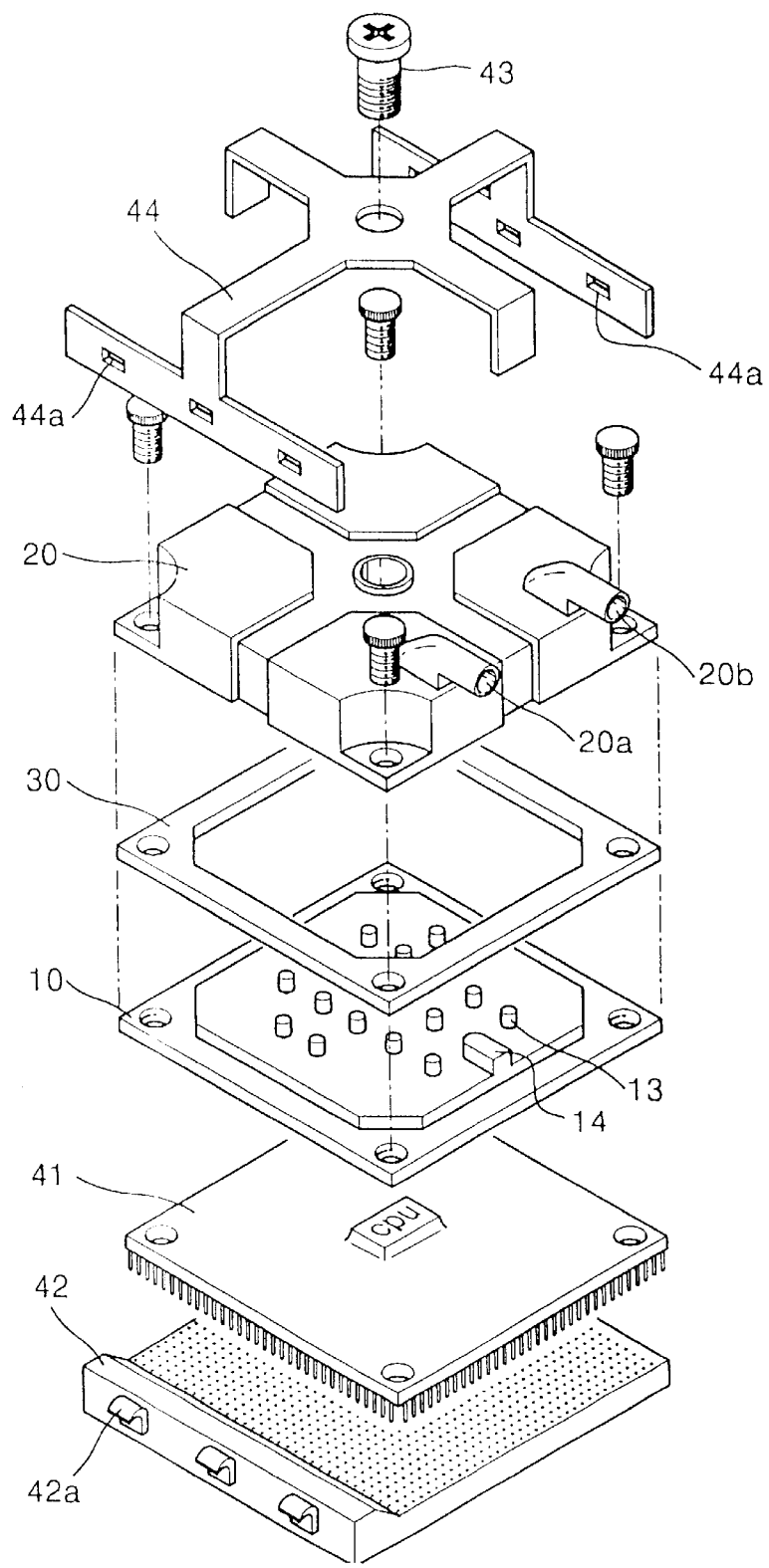
FIG. 3 is a partially exploded perspective view of illustrating the structure in a water cooling type cooling block shown in FIG. 2 is assembled to a CPU of a computer.

In order to fix the water cooling type cooling block for a semiconductor chip according to the present invention to a CPU 41, the cooling block is configured to be fixed at either side, locking grooves 44a are locked to hooks 42a of a mounting plate 42 on which the CPU 41 is mounted, and a pressing plate 44 for compressively fastening the heat transfer plate 10 and the case 20 by screwing in tightening screws 43 is installed, as shown in FIG. 3. In such a manner, the cooling block directly contacting the semiconductor chip is easily and securely attached to or detached from the semiconductor chip.

Figure 5:
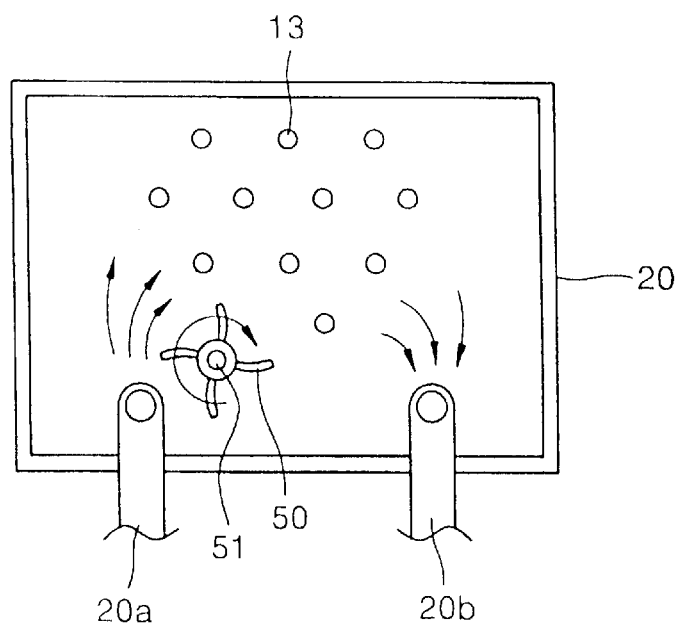
FIG. 5 is a plan view of another mode of FIG. 4.

As shown in FIGS. 5 and 8, an impeller 50 for allowing a user to easily confirm the flow state of a coolant and to measure the quantity of flow of the coolant using the rotation speed thereof may be further installed inside the case 20 of the water cooling type cooling block for a semiconductor chip according to the present invention.

Although not shown, a rotation speed sensor for accurately measuring the flow rate of the coolant may be installed on a rotation shaft 51 of the impeller 50.

Thus, when the coolant is introduced to the impeller 50 to then flow from the coolant inlet port 20a to the coolant outlet port 20b, the impeller 50 collides with the coolant while rotating, so that the user can recognize the flow of the coolant and the actual flow rate of the coolant can be expressed quantitatively for being accurately controlled.

Also, as shown in FIG. 8, the water cooling type cooling block for a semiconductor chip according to the present invention may be assembled by torsional screwing such that the case 20 is fabricated in a cylindrical shape, the impeller 50 is installed at the center of the case 20 and a male screw part and a female screw part are formed in the heat transfer plate 10 and the case 20, respectively. Here, vast numbers of ribs 13 preferably have various shapes.

Figure 9:
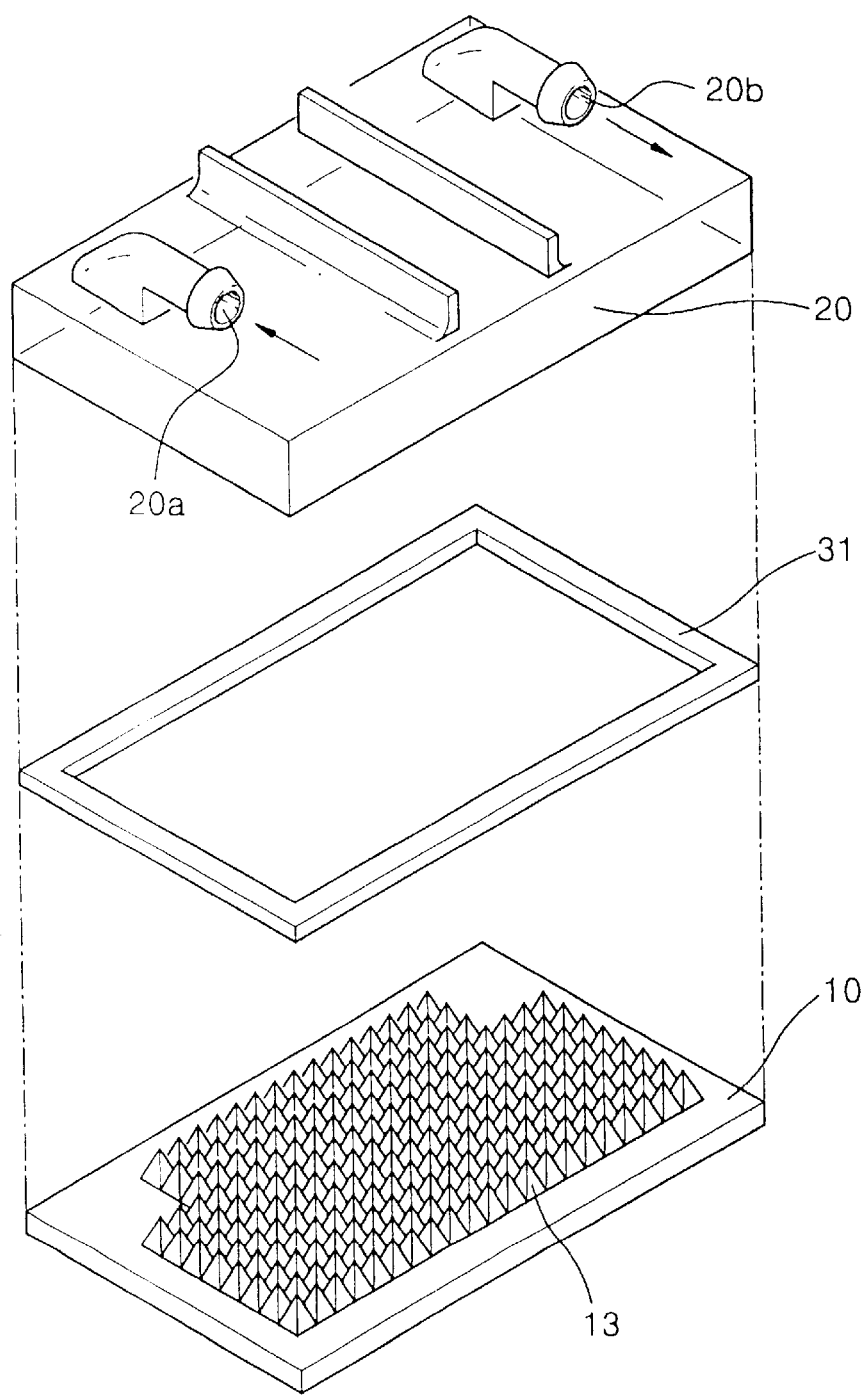
FIG. 9 is an exploded perspective view of a water cooling type cooling block according to still another embodiment of the present invention.

Alternatively, as shown in FIG. 9, vast numbers of ribs 13 may be pyramidally formed in the heat transfer plate 10. A packing member 31 is interposed between the heat transfer plate 10 and a transparent case 20 and a perfect seal is formed to be incorporated by ultrasonic heat fusion.

Instead of the triangular pyramidal ribs 13, rectangular or multi-sided pyramidal ribs may be formed to cause turbulent flow of a coolant to further improve a heat transfer coefficient.

Figure 10:
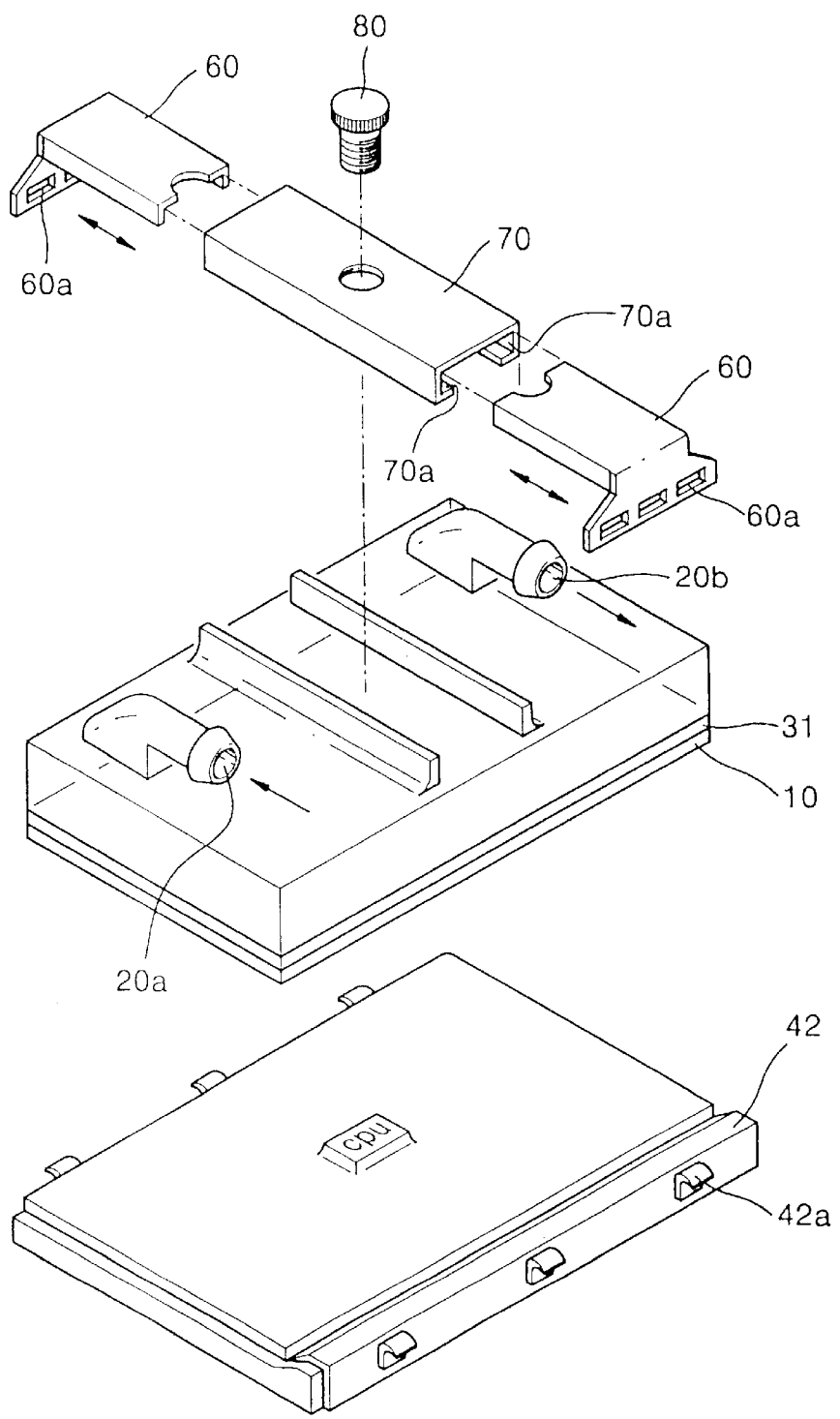
FIG. 10 is an exploded perspective view illustrating the state in which the water cooling type cooling block shown in FIG. 9 is connected with a semiconductor chip.

Referring to FIG. 10, a fixing device for fixing the water cooling type cooling block for a semiconductor chip according to the present invention closely fixes the case 20 to the semiconductor chip such that locking grooves 60a of left and right locking plates 60 are latched to hookers 42a of a semiconductor chip mounting plate 42 a guide plate 70 having rails 70a at either side is installed to adjust the width of each of the locking plates 60 by freely slidable movement of the left and right locking plates 60. Also, a tightening screw 80 penetrating through the center of the guide plate 70 to press the guide plate 70 toward the semiconductor chip can be provided, thereby fixing the left and right locking plates 60 to the semiconductor chip mounting plate 42.

The above-described slidable fixing device in which the width of each of the left and right locking plates 60 can be applied to CPUs having various dimensions.

Figure 11:
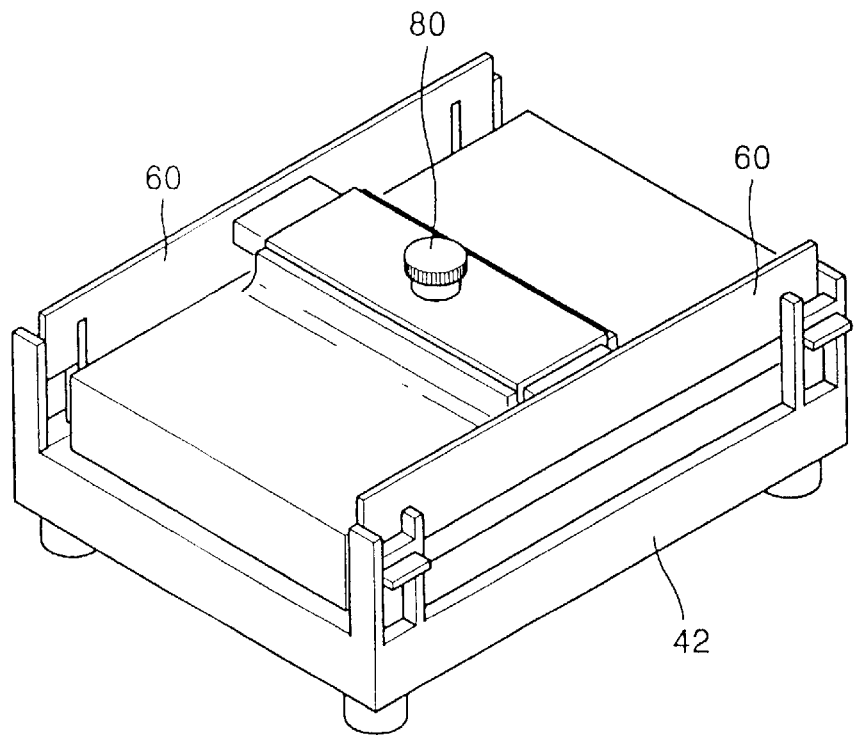
FIG. 11 is a perspective view illustrating another connection state of the water cooling type cooling block shown in FIG. 10.

Another example of the slidable fixing device is shown in FIG. 11, illustrating that lengths of the left and right locking plates 60 are increased to be fixed to semiconductor chip mounting plates having various dimensions.

Figure 12:
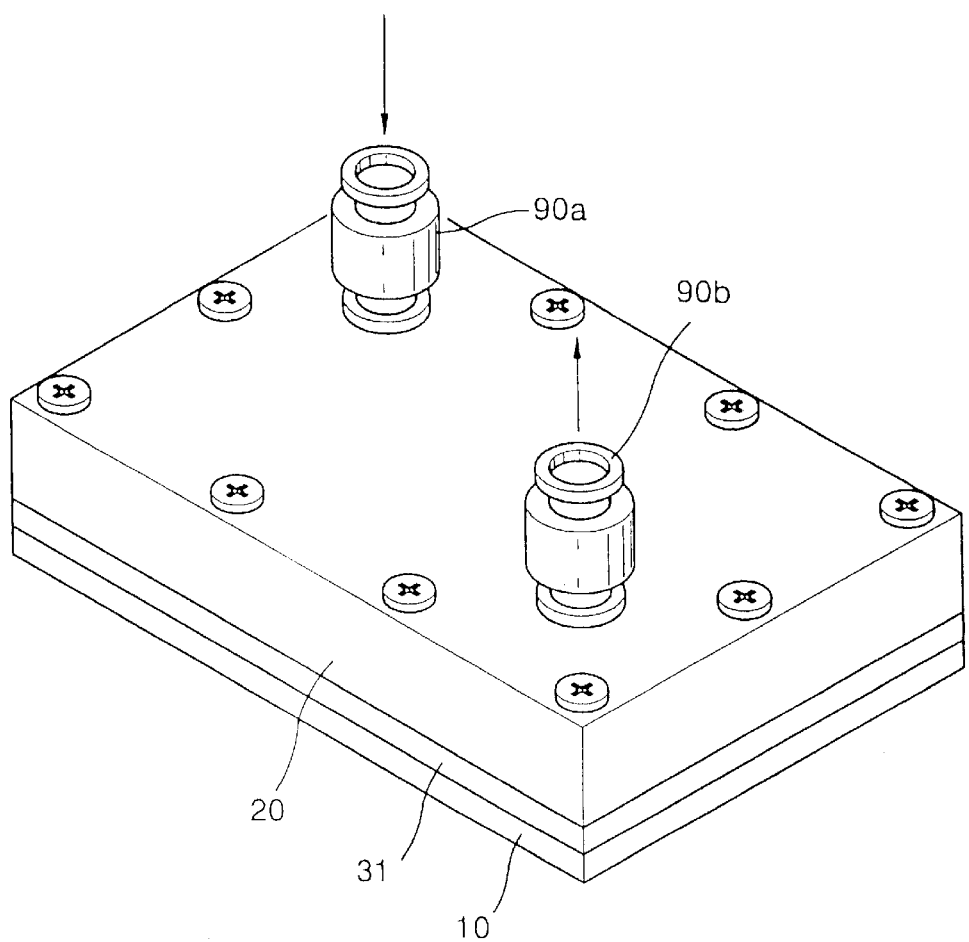
FIG. 12 is a perspective view of a water cooling type cooling block for a semiconductor chip according to still another embodiment of the present invention.

In another embodiment of according to the present invention, the water cooling type cooling block for a semiconductor chip can be made very compact such that a coolant inlet tube 90a and a coolant outlet tube 90b are vertically disposed, as shown in FIG. 12.

The effect of the water cooling type cooling block according to the present invention can be confirmed through comparison of heat resistances of the conventional passageway type cooling block and the rib type cooling block according to the present invention, which are dependent on the amount of coolant circulating in the respective cooling blocks.

Figure 13:
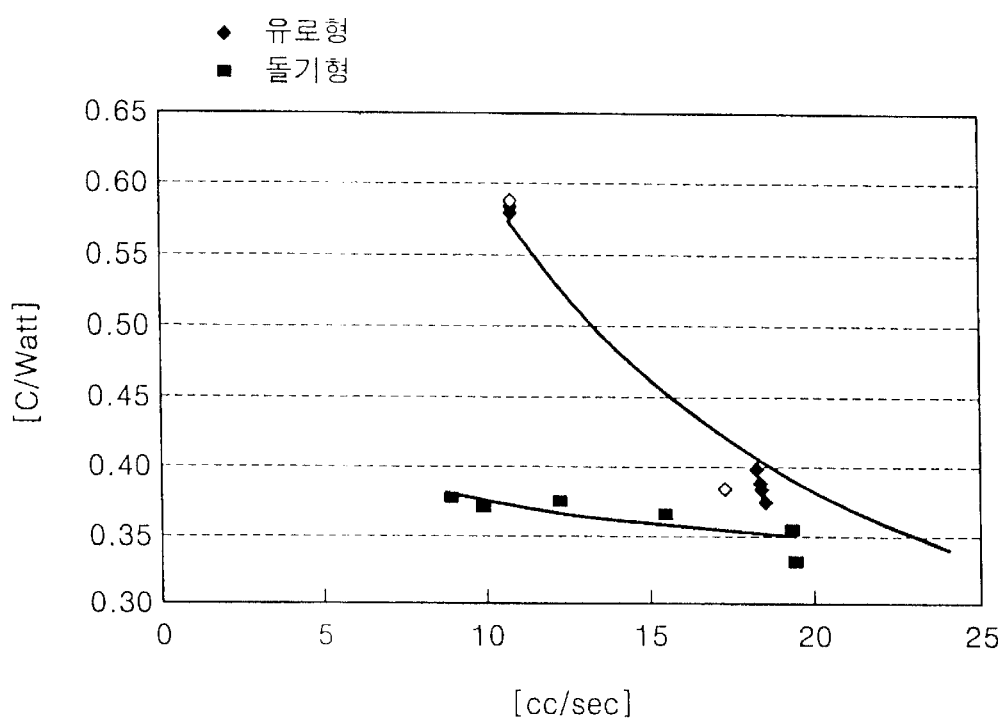
FIG. 13 is a graph showing coolant circulating amount dependency of thermal resistances of the conventional water cooling type cooling block for a passageway type semiconductor chip and the water cooling type cooling block for a rib type semiconductor chip according to the present invention.

As shown in FIG. 13, as the circulating amount of coolant is reduced, the heat resistance of the conventional passageway type cooling block is sharply decreased, while the rib type cooling block according to the present invention is little affected by the amount of circulating coolant.

The heat resistance is the reciprocal of heat transfer coefficient. Smaller heat resistance is advantageous for heat transfer. Thus, the rib type cooling block according to the present invention is better than the conventional passageway type cooling block from the view point of heat transfer efficiency.

In other words, in the case of the conventional passageway type cooling block, if the amount of circulating coolant is reduced, heat transfer efficiency is sharply decreased. In the case of the rib type cooling block according to the present invention, even if the amount of circulating coolant is reduced, heat transfer efficiency can be maintained because turbulent flow can be easily formed.

In addition to the heat transfer efficiency, the rib type cooling block according to the present invention is advantageous from the viewpoint of an increased heat transfer surface.

Figure 14:
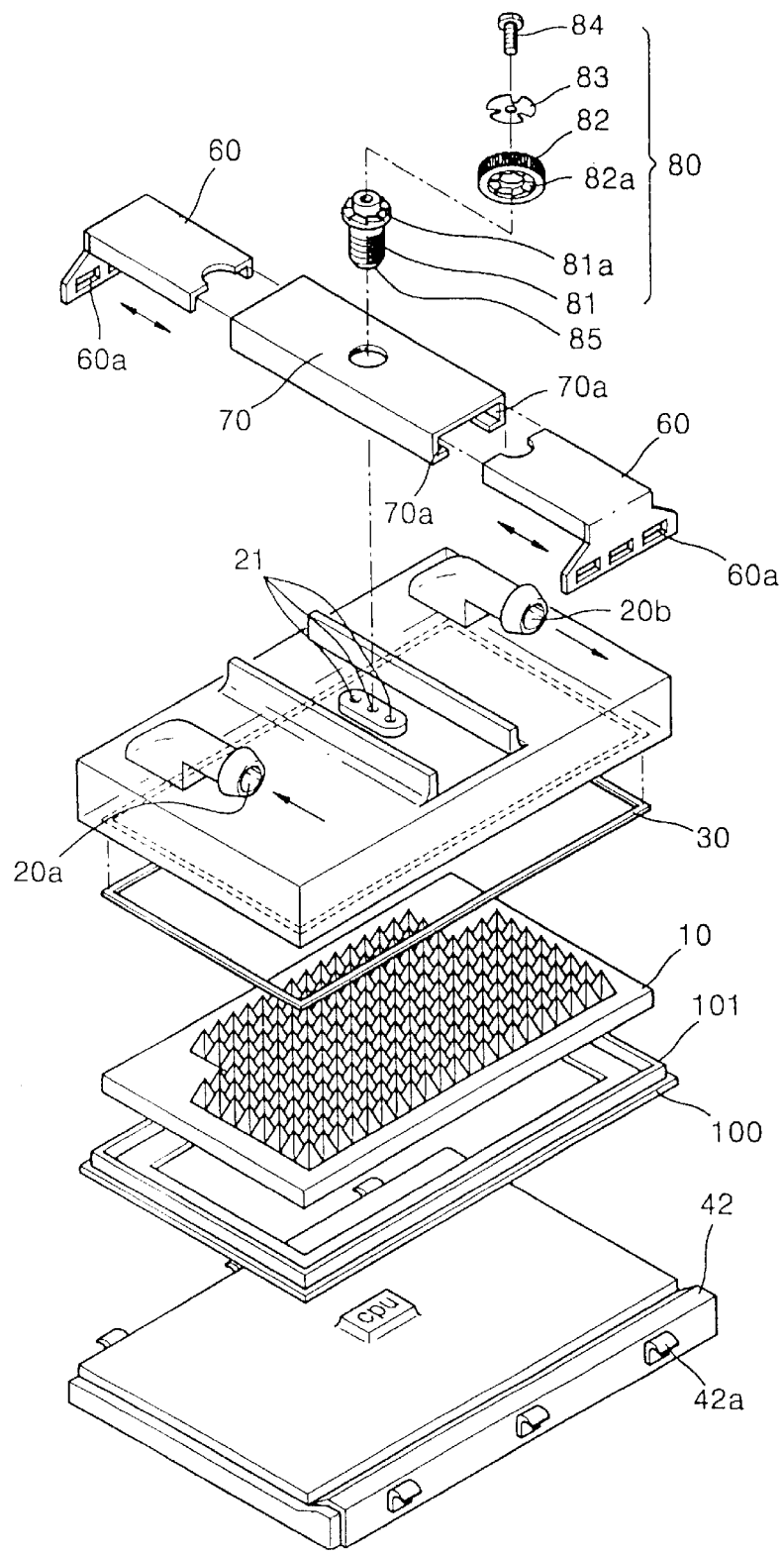
FIG. 14 is a perspective view of another example of the water cooling type cooling block shown in FIG. 10.

As shown in FIG. 14, all kinds of screws are generally used as the tightening screw 80, and a screw that is separated into a screw body 81 and a screw head 82 so as to race when a pressure exceeding a predetermined extent is applied during forward movement of the screw, which is so-call a safety bolt or click bolt, is preferably used.

In detail, the tightening screw 80 includes the screw body 81, the screw head 82, forward toothed projections 81a, backward toothed projections 82a, a plate spring 83 and a compressive tightening screw 84.

Here, the screw body 81 penetrates the center of the guide plate 70 to then press the guide plate 70 in a direction of a semiconductor chip (indicated by CPU in the drawing), and the screw head 82 has a groove formed in the outer periphery so as to be gripped by a user for rotation.

Also, the forward toothed projections 81a are configured such that toothed projections each having a slope portion tilted in one direction and a vertical portion are circularly arranged on the top plane of the screw body 81. The backward toothed projections 82a are configured such that toothed projections each having a slope portion tilted in the other direction and a vertical portion so as to contiguously correspond to the forward toothed projections 81a are circularly arranged on the bottom plane of the screw head 82.

Since the forward toothed projections 81a and the backward toothed projections 82a are engaged, rotation power is transferred from the screw head 82 to the screw body 81 during backward rotation of the screw head 82, at which vertical portions of the corresponding projections 81a and 82a are made to contact each other, making the screw moves backward. However, during forward rotation of the screw head 82, at which slope portions are made to contact each other, the screw head 82 races and rotation power is interrupted so that the screw does not move forward any more.

In this case, the plate spring 83 serves to allow the screw head 82 and the screw body 81 to closely contact each other so as to transfer rotation power to make the screw move forward. The plate spring 83 has a restoration force for compressing the backward toothed projections 82 of the screw head 82 in a direction of the forward toothed projections 81a of the screw body 81.

In particular, in order to adjust the restoration force of the plate spring 83, installed is a compression adjusting screw 84 screwed down to the screw body 81, for adjusting a compressive force acting on the plate spring 83 while moving back and forth.

If a user grips the screw head 82 by hand for forward rotation, the screw head 82 and the screw body 81 come into close contact with each other through the plate spring 83. Thus, friction between slopes acts to make the screw body 81 rotate together with the screw head 82 to transfer rotation force, thereby making the tightening screw 80 move forward.

Subsequently, if the tightening screw 80 excessively moves forward to apply an excess force to the semiconductor chip, the screw head 82 and the screw body 81 overcome the restoration force of the plate spring 83, that is, the friction, the respective slopes of the forward and backward toothed projections 81a and 82a are slidingly alienated from each other, so that the screw body 81 cannot rotate and only the screw head 82 races.

If the screw head 82 races, vibration and sound are generated as the screw head 82 bumps against the forward and backward toothed projections 81a and 82a. Thus, the user can perceive the vibration and sound to make the screw head 82 stop rotating.

Thus, if a predetermined compressive force or greater is applied to the semiconductor chip by the restoration force of the plate spring 83, the screw head 82 of the tightening screw 80 races even at forward rotation, thereby preventing an excessive force from being applied to the semiconductor chip. The restoration force of the plate spring 83 can be adjusted to be increased or decreased by making the compressive force adjusting screw 84 move back and forth.

In order to reduce friction between the tightening screw 80 and the case 20 during screw rotation, the tightening screw 80 has a spherical projection 85 at a portion contacting with the case 20.

Also, the case 20 has a seating groove 21 thereon to allow the spherical projection 85 to be seated. As the seating groove 21, there may be provided a plurality of grooves (e.g., three as shown in the drawing) aligned so as to compress the semiconductor chip as the tightening screw 80 horizontally moves according to the position of semiconductor chip.

Thus, since the tightening screw 80 is variably applied to semiconductor chips manufactured by various manufacturers and positioned at various positions, it can be used in semiconductor chips for general purposes.

The case 20 includes a packing member 30 to establish a perfect seal with the heat transfer plate 10 and a bracket 100 which covers the edge of the heat transfer plate 10 so as to allow ultrasonic fusion. The bracket 100 has an ultrasonically fusible plane 101 having fine projections to be molten and adhered during ultrasonic fusion, thereby further increasing the sealing efficiency.

Although the preferred embodiments of the invention have been illustrated and described herein, it is intended to be understood by those skilled in the art that various modifications and omissions in form and detail may be made without departing from the spirit and scope of the invention as defined by the appended claims.

For example, although the water cooling type cooling block according to the present invention has been described that it is applied to a semiconductor chip, it can be applied to various heat-dissipating components. Also, installation places and shapes of the impeller can be varied.

Therefore, the spirit and scope of the present invention are to be limited only by the terms of the appended claims.

As described above, in the water cooling type cooling block for a semiconductor chip according to the present invention, a heat transfer area and heat transfer efficiency can be improved by increasing the circulation speed of a coolant. Also, heat resistance can be reduced by inducing turbulent flow of a coolant, which is advantageous for heat transfer. Further, since a user can observe the circulation state of a coolant or the internal state of the cooling block by user's naked eye, the cooling block can be replaced with new one or a coolant can be replaced before cooling efficiency is deteriorated. Further, the temperature of the semiconductor chip can be accurately measured by providing a sensor surrounded by an insulating material. Also, damage to the semiconductor chip due to excessive forward movement of the tightening screw can be prevented. The position of the tightening screw can be changed according to variable positions of the semiconductor chip, while further increasing the sealing efficiency of the case.

The illustrated embodiments are only examples of the present invention and, therefore, are non-limitive. It is to be understood that many changes in the particular structure, materials and features of the invention may be made without departing from the spirit and scope of the invention. Therefore, it is my intention that my patent rights not be limited by the particular embodiments illustrated and described herein, but rather are to be determined by the following claims, interpreted according to accepted doctrines of patent claim interpretation, including use of the doctrine of equivalents and reversal of parts.

What is claimed is:

1. A water cooling type cooling block for a semiconductor chip comprising a heat transfer plate contacting the semiconductor chip, a case connected to the heat transfer plate to enclose the heat transfer plate so as to accommodate a coolant for cooling heat from the heat transfer plate and having a coolant inlet port at its first end and a coolant outlet port at its second end so as to allow movement of the coolant, and a sealing means hermetically sealing the heat transfer plate and the case, wherein the heat transfer plate is formed of a metal having high heat conductivity, and has a plurality of ribs entirely shaped of a flat plate on the surface opposite to a surface contacting the semiconductor chip for increasing a heat transfer surface to increase a heat transfer area, to induce turbulent flow of a coolant and to prevent a heat transfer coefficient from decreasing even if the flow rate is reduced.

2. The water cooling type cooling block according to claim 1, wherein a sensor surrounded by an insulating material for accurately measuring the temperature of a semiconductor chip is installed on a surface contacting the semiconductor chip of the heat transfer plate so as to face the heat transfer plate, the ribs are uniformly distributed throughout the heat transfer plate, and a guide member for guiding the coolant to flow toward the semiconductor chip is provided.

3. The water cooling type cooling block according to claim 1, wherein the case is formed of a transparent material so as to allow a user to observe the internal state of the case.

4. The water cooling type cooling block according to claim 1, further comprising an impeller rotating by the flow of the coolant for identifying the circulation state of the coolant and measuring the flow rate of the coolant, the impeller formed inside the case.

5. The water cooling type cooling block according to claim 1, further comprising:
   left and right locking plates latched to hookers of a semiconductor chip mounting plate so as to securely fixing the case to the semiconductor chip;
   a guide plate having rails at either side installed to adjust the width of each of the locking plates by freely slidable movement of the left and right locking plates; and
   a tightening screw penetrating through the center of the guide plate to press the guide plate toward the semiconductor chip.

6. The water cooling type cooling block according to claim 5, wherein the tightening screw comprises:
   a screw body which penetrates the center of the guide plate to then press the guide plate in a direction of the semiconductor chip, so as to race when a predetermined compressive force or greater is applied during forward movement of the screw;

a screw head having a groove formed in the outer periphery so as to be gripped by a user for rotation;

forward toothed projections formed on the top surface of the screw body;

backward toothed projections formed on the bottom surface of the screw head and contiguously facing the forward toothed projections;

a plate spring on which a restoration force is applied so that the backward toothed projections of the screw head compress the forward toothed projections of the screw body; and a compression adjusting screw screwed down to the screw body, for adjusting a compressive force acting on the plate spring while moving back and forth.

7. The water cooling type cooling block according to claim 5, wherein the tightening screw comprises a spherical projection at a portion contacting with the case, and the case has a seating groove thereon to allow the spherical projection to be seated, the seating groove having a plurality of seating grooves aligned so as to compress the semiconductor chip as the tightening screw horizontally moves according to the position of semiconductor chip.

8. The water cooling type cooling block according to claim 1, wherein the case includes a packing member to establish a perfect seal with the heat transfer plate, and a bracket which covers the edge of the heat transfer plate so as to allow ultrasonic fusion, the bracket having an ultrasonically fusible plane having fine projections to be molten and adhered during ultrasonic fusion.

* * * * *